(12) United States Patent
Weiner et al.

(10) Patent No.: US 8,207,069 B2
(45) Date of Patent: Jun. 26, 2012

(54) ADVANCED MIXING METHOD FOR INTEGRATED TOOL HAVING SITE-ISOLATED REACTORS

(75) Inventors: Kurt H. Weiner, San Jose, CA (US); Tony P. Chiang, Campbell, CA (US); Aaron Francis, San Jose, CA (US); John Schmidt, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/189,894

(22) Filed: Jul. 25, 2011

(65) Prior Publication Data

US 2011/0281773 A1 Nov. 17, 2011

Related U.S. Application Data

(62) Division of application No. 11/647,881, filed on Dec. 29, 2006, now Pat. No. 8,011,317.

(51) Int. Cl.
*H01L 21/00* (2006.01)
*H01L 21/306* (2006.01)
*C40B 50/00* (2006.01)
*C40B 60/00* (2006.01)

(52) U.S. Cl. ........ 438/800; 438/907; 438/908; 438/913; 118/719; 156/345.31; 156/345.32; 506/23; 506/33; 506/40; 506/43

(58) Field of Classification Search ............... 118/719; 156/345.26, 345.29, 345.31, 345.32; 427/255.5; 414/935–941; 438/800, 907, 908, 913; 506/23, 506/33, 40, 43
See application file for complete search history.

(56) References Cited

U.S. PATENT DOCUMENTS

| | | | | |
|---|---|---|---|---|
| 4,913,929 A | * | 4/1990 | Moslehi et al. | 427/564 |
| 6,045,671 A | * | 4/2000 | Wu et al. | 506/40 |
| 6,136,269 A | * | 10/2000 | Winkler et al. | 506/40 |
| 6,270,582 B1 | * | 8/2001 | Rivkin et al. | 118/719 |
| 6,821,910 B2 | * | 11/2004 | Adomaitis et al. | 438/758 |
| 8,058,154 B2 | * | 11/2011 | Chiang et al. | 438/478 |
| 8,084,400 B2 | * | 12/2011 | Chiang et al. | 506/23 |
| 2002/0048536 A1 | * | 4/2002 | Bergh et al. | 422/130 |

* cited by examiner

*Primary Examiner* — Karla Moore

(57) ABSTRACT

An integrated processing tool is described comprising a full-wafer processing module and a combinatorial processing module. Chemicals for use in the combinatorial processing module are fed from a delivery system including a set of first manifolds. An output of each first manifold is coupled to at least one mixing vessel. An output of each mixing vessel feeds more than one of a set of second manifolds. An output of each set of second manifolds feeds one of multiple site-isolated reactors of the combinatorial processing module.

22 Claims, 10 Drawing Sheets

ADVANCED MIXING METHOD FOR INTEGRATED TOOL HAVING SITE-ISOLATED REACTORS

RELATED APPLICATIONS

This application is a Divisional application of U.S. patent application Ser. No. 11/647,881, filed Dec. 29, 2006. This application is related to U.S. patent application Ser. No. 11/418,689, filed May 5, 2006.

FIELD OF THE INVENTION

The disclosure herein relates generally to substrate processing and, more particularly, to substrate processing using integrated site-isolated processing and full-wafer processing.

BACKGROUND OF THE INVENTION

To achieve the desired performance enhancement for each successive generation of silicon integrated circuits (ICs), semiconductor manufacturing has become increasingly reliant on new materials and their integration into advanced process sequences. Unfortunately, typical semiconductor manufacturing equipment is not well suited for materials exploration and integration. Issues impacting the use of typical semiconductor manufacturing equipment include difficulty in changing process materials and chemicals rapidly, limited ability to integrate and sequence multiple materials or chemicals in a single reactor or process chamber, high equipment cost, large sample size (300 mm wafer) and inflexible process/reactor configurations. To complement traditional manufacturing tools, a need has arisen for process equipment that facilitates fast testing of new materials and materials processing sequences over a wide range of process conditions.

DETAILED DESCRIPTION

Figure 1:
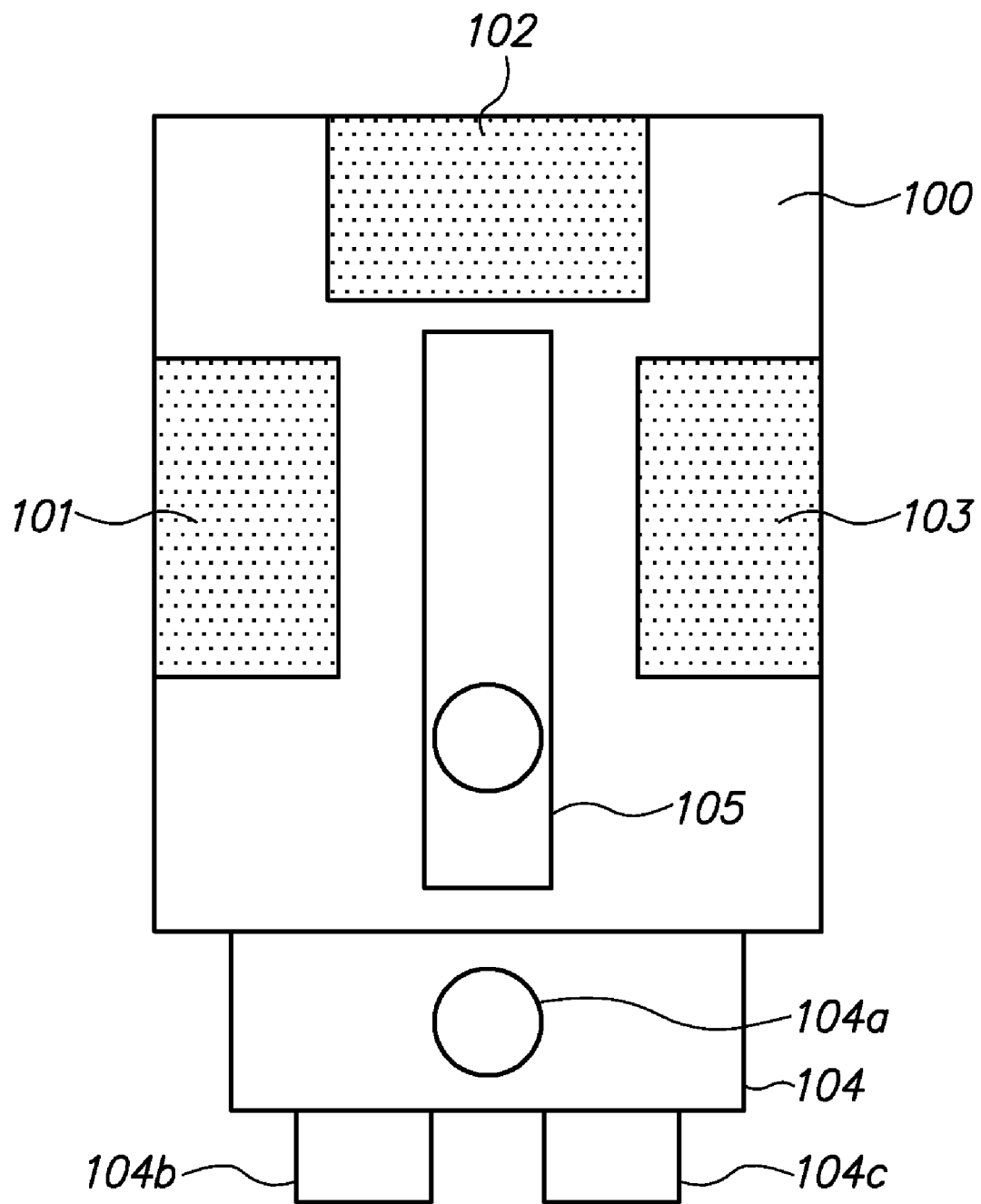
FIG. 1 is a substrate processing system (SPS), under an embodiment.

An integrated processing tool, referred to herein as a multiple channel site-isolated reactor (MCSIR), is described below. The MCSIR is comprised of a full-wafer processing module and a combinatorial, site-isolated processing module. A primary purpose of the integrated processing tool is to effect mixed-mode processing between full-substrate and multiple, site-isolated regions of the full substrate. As such, chemicals for use in the processing modules are fed from a common delivery system that includes a set of first manifolds that enable the creation of solutions whose composition can be varied in a combinatorial fashion and whose constituents can be specified as part of the recipe for the process sequence. To allow thorough solution mixing as well as accurate temperature and pH control, the output of each first manifold is coupled to at least one mixing vessel. The output of each mixing vessel is subsequently dispensed to one or more of a set of second manifolds. The output of each set of second manifolds feeds one or more reactors of the processing modules. In addition to providing solutions that are mixed statically in mixing vessels, the second set of manifolds enables multiple chemicals to be distributed simultaneously to facilitate dynamic, in-line mixing of solutions.

Regarding site-isolated processing, the MCSIR integrates multiple, independently-controlled process chambers that collectively address multiple independent sites on the full substrate. The MCSIR provides the ability to mix and dispense a variety of chemical solutions or compositions onto the substrate in one or more of a series and/or parallel manner, and provides the ability to independently vary flow and/or solution composition to any number of reactors or one or more subsets of reactors. The MCSIR provides the ability to synchronize process steps and control critical timing across all site-isolated reactors when a global parameter for the process sequence requires this type of synchronization for non-site-isolated control parameters (e.g. temperature of the wafer substrate, reactor height/volume, etc.).

By providing multiple, independently-controlled and plumbed reactors or process chambers across a single 200-or 300-mm silicon substrate, the MCSIR described herein addresses the issues that cause traditional semiconductor manufacturing equipment to not be well suited for materials exploration and integration. The configuration and flow dynamics of each site-isolated reactor is typically scaled from a production reactor, facilitating process scale-up to full wafers with minimal changes to the process integration sequence. In addition, materials delivery systems of the MCSIR are configured to enable greater flexibility in both the number of materials that are provided to the chamber as well as the steps in process sequence that are utilized to effect the materials integration. Reactor miniaturization and relaxed equipment requirements for materials research and integration also reduces the cost of the equipment compared to production tools.

Systems and methods for processing a substrate (e.g., forming material(s) on a substrate) are described below. The systems and methods for processing substrates, collectively referred to herein as "substrate processing systems" (SPSs), include combinatorial processing, combinatorial process sequences integrated with conventional substrate processing, and/or site-isolated processing, as described in detail below. The SPS of an embodiment enables production of very small structures and features on substrates (e.g., at the nanometer size scale) at very low cost, which can be useful in the commercial manufacturing of a variety of products, such as electronic components and flat panel displays to name a few. The various systems and methods described below are presented as examples only and are not intended to limit the systems and methods described and claimed herein to particular combinations of combinatorial processing, combinatorial process sequences integrated with conventional substrate processing, and/or site-isolated processing. Furthermore, the systems and methods described below are not limited to particular processes (e.g., wet processes, dry processes, etc.).

In the following description, numerous specific details are introduced to provide a thorough understanding of, and enabling description for, embodiments of the SPS. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiment.

The SPS of an embodiment generally includes at least one interface configured to receive at least one substrate. The SPS also includes a number of modules coupled to the interface. The modules, also referred to herein as components, include a pre-processing module, a processing module, and a post-processing module, but may include any number and/or type of other modules where any of the modules may include functions of the pre-processing, processing, and/or post-processing modules. The SPS is not required to include at least one of each of any particular module type. Also, functions of all of the pre-processing, processing, and post-processing modules may be embedded within a single module. Each module of the multiple modules can contain at least one of a number of different processes as appropriate to processes contained in at least one other of the modules. The SPS also includes at least one handler coupled to the interface and configured to move the substrate between the interface and one or more of the modules.

FIG. 1 is a substrate processing system (SPS) 100, under an embodiment. The substrate processing system 100 includes a pre-processing module 101, a processing module 102, and a post-processing module 103. The SPS 100 is not required to include at least one of each of the preceding module types; for example, a particular process flow may include only the processing module 102 and means for moving a substrate into and out of the system 100. Also, functions of all of the pre-processing, processing, and post-processing modules may be embedded within a single module. The modules 101, 102 and 103 can each be implemented using apparatus (in particular, conventional commercial substrate processing apparatus) as appropriate to the types of substrate processing for which the modules 101, 102 and 103 are to be used. The modules 101, 102, and 103 can be implemented with modification(s) and/or addition(s) depending on the particular characteristics of the substrate and/or processes.

Substrates enter and leave the system 100 via a system interface 104, also referred to as a factory interface 104. A single substrate can be processed at one time in the system 100 or multiple substrates can be processed at one time in a batch. The system interface 104 includes a substrate handler 104a (which can be implemented, for example, using a robot) that moves substrate(s) into and out of the system 100. To facilitate moving substrates into and out of the system 100, the system interface 104 includes a substrate load station 104b and a substrate unloading station 104c (also referred to as a Front Opening Unified Pod (FOUP) load station 104b and a FOUP unload station 104c, respectively).

After substrate(s) that have been processed are removed from the system 100 and placed on the substrate unload station 104c (for eventual movement to another location) by the substrate handler 104a, new substrate(s) that have previously been placed on the substrate load station 104b are taken from the substrate load station 104b by the substrate handler 104a and moved into the system 100 for processing. The system interface 104 (including the substrate handler 104a, substrate load station 104b and substrate unload station 104c) can be implemented using conventional apparatus and methods known to those skilled in the art of processing substrates. The system 100 of one or more alternative embodiments can include multiple system interfaces, each of which can be constructed and operate as described above.

Once in the system 100, a substrate handling system 105 can be used to move substrate(s) processed by the system 100 between different modules 101-103 of the system 100. Like the substrate handler 104a of the system interface 104, the substrate handling system 105 can be implemented, for example, using one or more robots. If the modules 101, 102 and 103 include both wet and dry processing modules, then the substrate handling system 105 includes at least two types of apparatus: a dry substrate handler for moving substrate(s) into and out of dry processing modules and the system interface 104 and out of a drying module, and a wet substrate handler for moving substrate(s) into and out of wet processing modules and into a drying module. The substrate handling system 105 can be implemented using apparatus and methods known to those skilled in the art of processing substrates.

Other than when substrate(s) are being moved into or out of the system 100 through the system interface 104, the system 100 is sealed from the external environment. Depending on the processing to be performed by the system 100, the environment within the system 100 that is outside of the pre-processing module 101, processing module 102, and post-processing module 103 (for convenience, sometimes referred to hereinafter as the "system environment") can be maintained at atmospheric pressure, held at a vacuum pressure, and/or pressurized (i.e., held at a pressure above atmospheric pressure). Similarly, the system environment can be maintained at the ambient temperature of the environment outside of the system 100, or at a temperature that is higher or lower than that ambient temperature.

Further, the gaseous composition of the system environment can be controlled as desired. For example, the system environment can be ambient air (typically, controlled to reduce contamination from the external environment). The system environment can also be controlled to include, in whole or in part, a specified gas or gases, e.g., in a system used to process semiconductor wafers, the system environment can be controlled to be nitrogen or an inert gas. The system environment can also be controlled to exclude a specified gas or gases, e.g., oxygen can be excluded from the system environment to reduce the occurrence of oxidation of substrate(s) (or material(s) formed thereon) processed in the system.

The SPS of an alternative embodiment can include multiples of each of the types of modules used to process a single wafer or single batch of wafers; therefore, multiple versions of the SPS can operate in parallel as a single system. This can improve the throughput of substrates processed by the SPS. This can also add redundancy so that system availability can be maintained even when one or more of the modules of the system are rendered non-operational for a period of time (e.g., for preventative maintenance, repair, etc.).

The SPS described above is presented as an example, and systems including other numbers of processing modules can be used. Furthermore, types of processing modules other than those described above can be used. Manual loading and unloading of substrate(s) may be used in some processing systems instead of a substrate handler for moving substrate(s) into and out of the system.

Figure 2:
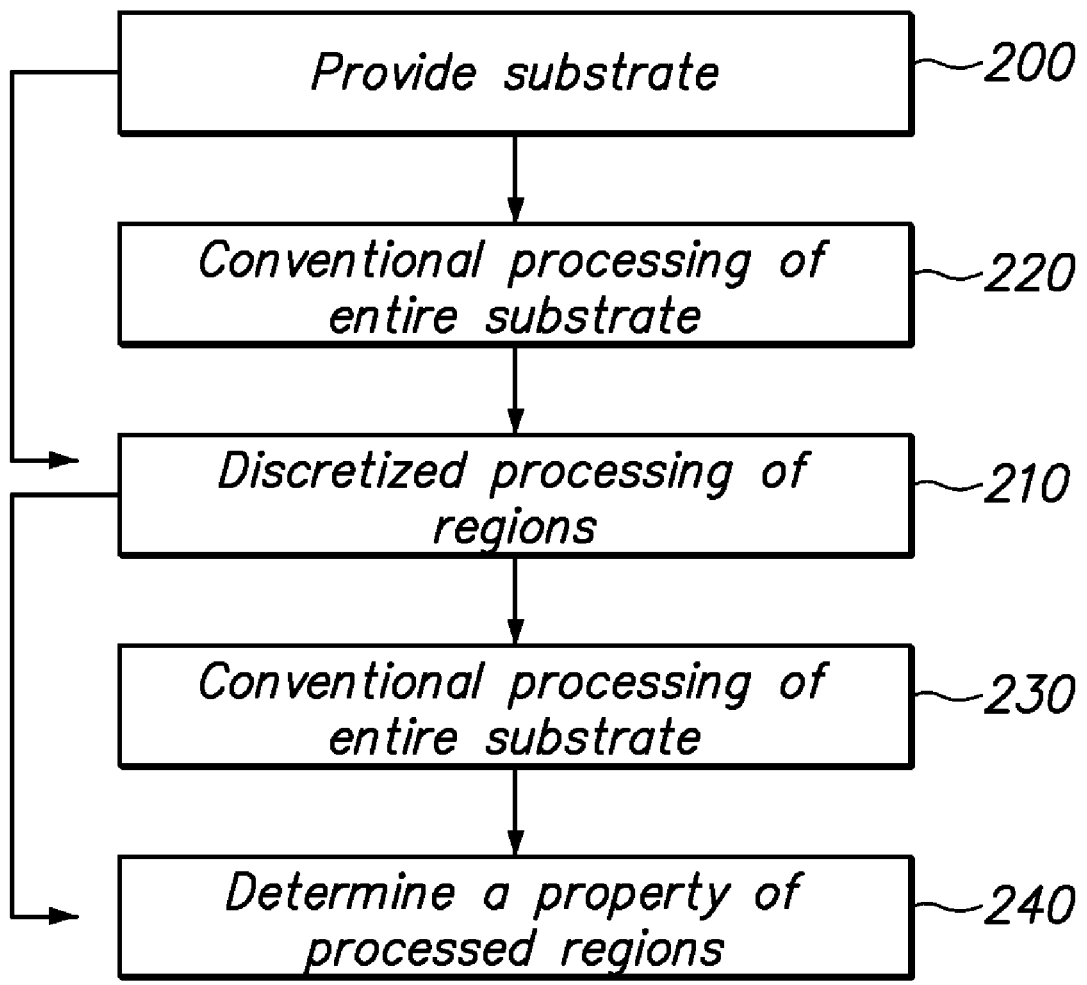
FIG. 2 is a flow diagram for combinatorial process sequence integration, under an embodiment.

The SPS 100 described above can include one or more modules (also referred to as components) and/or methods for combinatorially processing regions on a single substrate. Generally, an array of regions is combinatorially processed by delivering processing materials to one or more regions on a substrate and/or modifying the regions. The regions on a substrate of an embodiment include but are not limited to pre-defined regions and regions identified during and/or as a result of processing of the substrate. FIG. 2 is a flow diagram for combinatorial process sequence integration, under an embodiment. The embodiment may utilize a processing tool (which may or may not be an integrated tool comprised of discrete unit modules which collectively perform the effective unit process) that will perform the desired process for analysis. In one embodiment, the processing tool can perform the process in a discretized fashion within unique regions contained in a single monolithic substrate, such as a 300 mm diameter wafer used in IC manufacturing. The substrate is provided to the system 200, and is processed in a discretized, preferably isolated, fashion (either in a serial, parallel, or serial-parallel mode) whereby at least two regions of the substrate are processed differently from each other 210. The substrate processed in the combinatorial fashion can optionally be previously 220 and/or subsequently 230 processed in a conventional fashion with at least one process or process step, whereby the entire or substantially close to the entire substrate is subject to the same processing conditions. This allows the described combinatorial processing/combinatorial process sequence integration approach to be used in desired segments of the process flow required to build an end device(s), integrated circuit, etc.

The processed regions, such as devices or portions of devices created, can be tested 240 for a property of interest using conventional methods for analysis, such as parametric testing for properties such as yield, via resistance, line resistance, capacitance, etc. and/or reliability testing for properties such as stress migration, electromigration, bias thermal stress, time dependent dielectric breakdown, and related testing known to those of skill in the art. The processed regions can be tested simultaneously, sequentially, or in a parallel-serial mode, where a first plurality of regions is simultaneously tested, followed by a second plurality of regions being simultaneously tested. The testing 240 is optionally performed in one or more alternative embodiments of the methodology for combinatorial process sequence integration.

The combinatorial process sequence integration of an embodiment uses a processing tool referred to herein as a site-isolated processing tool (also referred to as a site-isolated reactor (SIR)) that performs one or more processes. In one embodiment, the site-isolated processing tool processes a substrate in a discretized, isolated fashion (either in a serial, parallel, or serial-parallel mode) within unique regions of the substrate (e.g., at least two regions of the substrate are processed differently from each other). In processing an array of regions, as described herein, processing materials can be delivered to regions (including predefined regions) on a substrate and/or the regions (including predefined regions) can be modified using any number of site-isolated processing processes or sequences in combination with any number of conventional processing processes or sequences.

For example, a method under the combinatorial process sequence integration described herein receives a substrate from at least one first process selected from a group including depositing, patterning, etching, cleaning, planarizing, implanting, and treating. The method generates a processed substrate by processing at least one region of the substrate differently from at least one other region of the substrate. The processing includes modifying at least one region, wherein modifying includes at least one of physical modifications, chemical modifications, electrical modifications, thermal modifications, magnetic modifications, photonic modifications, and photolytic modifications. The processing forms at least one array of differentially processed regions on the substrate. In one embodiment, the processing described above includes modifying using at least one of materials, processing conditions, process sequences, process sequence integration, and process sequence conditions. In one other embodiment, the processed substrate described above is subjected to at least one additional process selected from a group including depositing, patterning, etching, cleaning, planarizing, implanting, and treating.

As another example, a method under the combinatorial process sequence integration described herein generates a processed substrate by processing at least one region of the substrate differently from at least one other region of the substrate. The processing includes modifying at least one region, wherein modifying includes at least one of physical modifications, chemical modifications, electrical modifications, thermal modifications, magnetic modifications, photonic modifications, and photolytic modifications. The processing forms at least one array of differentially processed regions on the substrate. The method continues by providing the processed substrate to at least one additional process selected from a group including depositing, patterning, etching, cleaning, planarizing, implanting, and treating. In one embodiment, the processing described above includes modifying using at least one of materials, processing conditions, process sequences, process sequence integration, and process sequence conditions.

Figure 3:
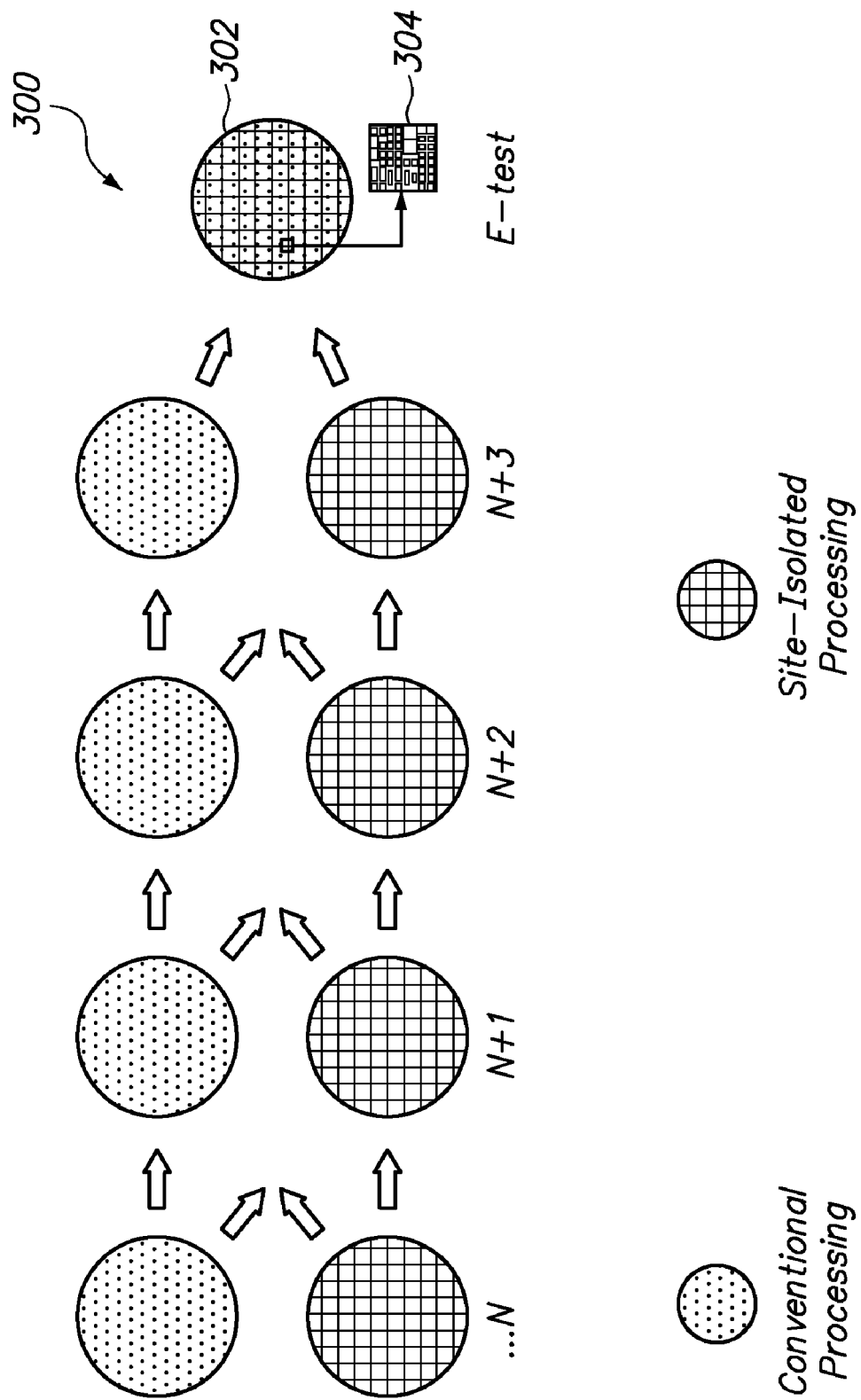
FIG. 3 is a combinatorial process sequence integration process flow that includes site-isolated processing and/or conventional processing, under an embodiment.

FIG. 3 is a combinatorial process sequence integration process flow 300 that includes site-isolated processing and/or conventional processing, under an embodiment. One example of a processing sequence under the embodiments herein is as follows: process the substrate using Conventional Process N, then process the substrate using Site-Isolated Process N+1, then process the substrate using Site-Isolated Process N+2, then process the substrate using Conventional Process N+3, then perform E-test (e.g., electrical testing). Another example of a processing sequence under the embodiments herein is as follows: process the substrate using Site-Isolated Process N, then process the substrate using Site-Isolated Process N+1, then process the substrate using Conventional Process N+2, then process the substrate using Site-Isolated Process N+3, then perform E-test. Yet another example of a processing sequence under the embodiments herein is as follows: process the substrate using Site-Isolated Process N, then process the substrate using Conventional Process N+1, then process the substrate using Site-Isolated Process N+2, then process the substrate using Conventional Process N+3, then perform E-test. Various other processing sequences can be effected according to the process flow 300.

The combinatorial process sequence integration thus generates for example a semiconductor wafer 302 comprising a die array that includes a plurality of dies 304 that can be test dies and/or actual product dies containing intended integrated circuitry. Blanket wafers, pattern wafers, devices, functional chips, functional devices, test structures, semiconductors, integrated circuits, flat panel displays, optoelectronic devices, data storage devices, magnetoelectronic devices, magnetooptic devices, molecular electronic devices, solar cells, photonic devices, and packaged devices can be processed and/or generated using the aforementioned combinatorial process sequence integration methodology. The combinatorial process sequence integration can be applied to any desired segment(s) and/or portion(s) of an overall process flow. Characterization, including electrical testing, can be performed after each process step, and/or series of process steps within the process flow as needed and/or desired.

Embodiments of the SPS deliver processing materials to one or more predefined regions on the substrate, and react the delivered materials using a number of different techniques. For example, the processing materials can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Other useful reaction techniques that can be used to react the processing materials of interest will be readily apparent to those of skill in the art.

Since the regions of the substrate are processed independently of each other, the processing conditions at different regions can be controlled independently. As such, process material amounts, reactant solvents, processing temperatures, processing times, processing pressures, the rates at which the reactions are quenched, deposition order of process materials, process sequence steps, etc. can be varied from region to region on the substrate. Thus, for example, when exploring materials, a processing material delivered to a first and a second region can be the same or different. If the processing material delivered to the first region is the same as the processing material delivered to the second region, this processing material can be offered to the first and second regions on the substrate at either the same or different concentrations. This is true as well for additional processing materials delivered to the first and second regions, etc. As with the processing material delivered to the first and second regions, the additional processing materials delivered to the first and second regions can be the same or different and, if the same, can be offered to the first and second regions on the substrate at either the same or different concentrations.

Moreover, within a given predefined region on the substrate, the processing materials can be delivered in either a uniform or gradient fashion. If the same processing materials are delivered to the first and second regions of the substrate at identical concentrations, then the conditions (e.g., reaction temperatures, reaction times, etc.) under which the regions are processed can be varied from region to region. Parameters which can be varied include, for example, material amounts, solvents, process temperatures, process times, the pressures at which the processes are carried out, the atmospheres in which the processes are conducted, the rates at which the processes are quenched, the order in which the materials are deposited, etc. Other process parameters which can be varied will be apparent to those of skill in the art.

Moreover, an embodiment provides for forming at least two different arrays of materials by delivering substantially the same processing materials at approximately identical concentrations to corresponding regions on both first and second substrates having different surfaces, such as a dielectric material surface and an electrically conductive surface, in order to represent different portions of regions on an IC chip, and, thereafter, subjecting the process materials on the substrates to a first set of process conditions. Using this method, the effects of the process parameters or materials on the various substrate surfaces can be studied and, in turn, optimized.

The processing materials utilized in the processing of the individual regions must often be prevented from moving to adjacent regions. Most simply, this can be ensured by leaving a sufficient amount of space between the regions on the substrate so that the various processing materials cannot interdiffuse between regions. Moreover, this can be ensured by providing an appropriate barrier between the various regions on the substrate during processing. In one approach, a mechanical device or physical structure defines the various regions on the substrate. A wall or other physical barrier, for example, can be used to prevent the materials in the individual regions from moving to adjacent regions. This wall or physical barrier may be removed after the synthesis is completed. One of skill in the art will appreciate that, at times, it may be beneficial to remove the wall or physical barrier before screening the array of materials.

In other embodiments, the processing may be effected without the need of barriers which physically touch the substrate. For example, lasers, radiative lamps, UV radiation sources, other "point" sources can be used to process regions in a site addressable fashion as the area of modification is nominally smaller and/or equivalent in size to the discrete regions of interest on the substrate. In yet another embodiment, a physical barrier can be used to essentially screen and/or limit the processing to a desired region(s) and/or portion(s) of a region(s) wherein the physical barrier does not physically touch the substrate. For example, a physical barrier can be used to essentially block and/or restrict processing to certain region(s) and/or portion(s) or region(s). A screen, such as a mask or shutter, can be used to block vapor fluxes such as from PVD (i.e. sputtering) or evaporation sources for example. An opaque vs. transparent mask can be used to let certain radiation through the transparent regions to effect processing in specified regions on the substrate. In yet another embodiment, gas flows, of preferably an inert gas such as argon (Ar), can be used to screen out gaseous reagents and or limit the concentrations of such reagents so as to effectively screen out the effects of such reagents from certain regions. In this fashion, specific regions on a substrate can be processed differently without the need for a physical barrier in communication with the substrate. This approach is particularly amenable to sequential gas phase vacuum based surface kinetic processes such as atomic layer deposition and various forms thereof (e.g., ion, radical, and plasma induced/enhanced).

The SPSs of an embodiment include processing tools configured to effect both uniform processing across an entire substrate and independent processing of one or more discrete regions of the substrate individually. The processing tools described herein, which include operations under the combinatorial process sequence integration process flows described above with reference to FIGS. 2 and 3, can be a component of a substrate processing system like the SPS 100 described above and/or one or more modules of the SPS 100 described above with reference to FIG. 1. The combinatorial process sequence integration process flow 300 of FIG. 3 can be embodied in a processing module 102 of the SPS 100 (FIG. 1), for example. Similarly, the combinatorial process sequence integration process flow 300 can be embodied across one or more processing modules 101, 102, and 103 of the SPS 100 (FIG. 1) as another example.

Figure 4:
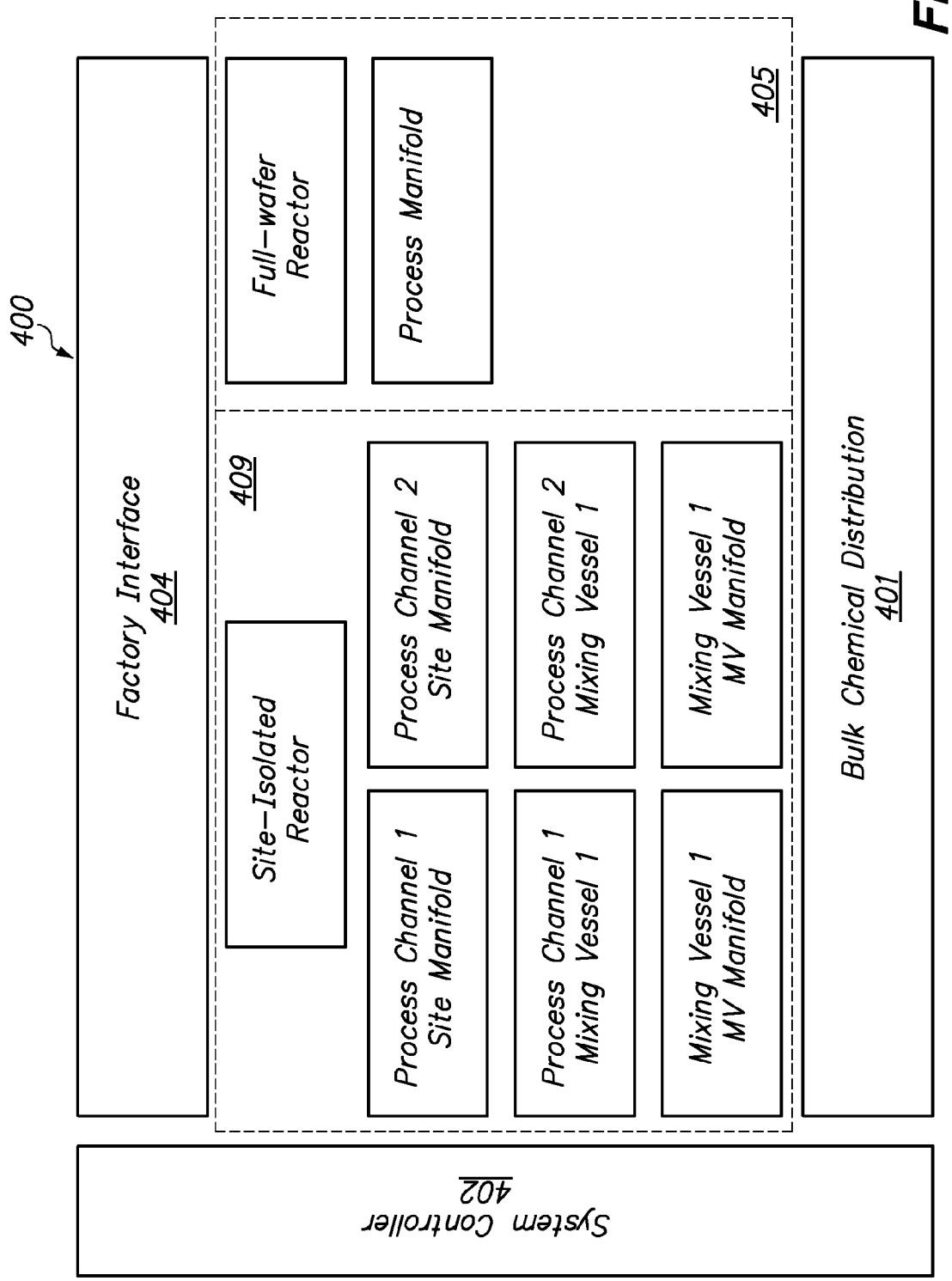
FIG. 4 is a block diagram of the integrated processing tool, referred to herein as a Multiple Channel Site-Isolated Reactor (MCSIR), under an embodiment.

The SPSs of an embodiment includes an integrated processing tool that supports both full-wafer processing and combinatorial processing. FIG. 4 is a block diagram of the integrated processing tool 400, referred to herein as a Multiple Channel Site-Isolated Reactor (MCSIR) 400, under an embodiment. The MSCIR 400 includes a full-wafer processing module 405 and a site-isolated processing module (SIPM) 409, as described in detail below. The MCSIR 400 incorporates a bulk chemical distribution system to provide the raw chemicals 401 necessary to effect the process sequence, as well as chemical mixing and sequencing hardware in the form of mixing vessels and distribution manifolds to provide the ability to dynamically mix chemical solutions of any composition as well as to sequence the chemicals through the reactors in any order for any time duration. The MCSIR 400 is controlled using a computerized hardware controller 402, and the same controller of an embodiment effects processing in both the full-wafer reactor and site-isolated reactor. Wafers are sequenced through the MCSIR 400 using a factory interface 404. The full-wafer and site-isolated reactors are comparable in all control aspects. Each reactor or channel of the MCSIR 400 is configured to allow the implementation of complex wet/vapor-process sequences as described herein.

Generally, the full-wafer processing module 405 includes a process manifold coupled to a full-wafer reactor. The process manifold is coupled to the chemicals 401 and is configured to feed or deliver the chemicals 401 to the full-wafer reactor. The full-wafer reactor is configured to effect uniform processing across the entire wafer or substrate surface (e.g., 8-inch wafer, 12-inch wafer, etc.) using the delivered chemicals.

In contrast, the SIPM 409 is a site-isolated processor that enables independent processing of multiple discrete regions (e.g., 28 regions) across the wafer using multiple channels or process paths. This example of the SIPM 409 shows a single site-isolated reactor being fed by either of two process paths or channels for the sake of clarity of this example, but the MCSIR can include any number of site-isolated reactors and any number of process paths connected to each reactor.

The SIPM 409 feeds or distributes the chemicals 401 using a delivery system generally including a set or assembly of first manifolds (e.g., mixing vessel (MV) 1 manifold). An output of each first manifold is coupled to a mixing vessel (e.g., mixing vessel 1, etc.). The mixing vessel manifolds allow mixing of the bulk chemicals in any ratio for each of the mixing vessels, and the mixing vessels then serve as temporary storage for the mixed chemical solutions.

The output of each mixing vessel feeds one or more of a set of second manifolds (e.g., process channel 1 site manifold, process channel 2 site manifold). An output of each set of second manifolds feeds a site-isolated reactor. The set of second manifolds generally allows sequencing of the mixing vessel solutions and/or bulk chemicals through either of two process paths (e.g., channel 1, channel 2) in a set of flow cells. The flow cells comprise the top surface of the site-isolated reactor, and reactor sleeves comprise the side walls of the reactor. The processed substrate comprises the bottom of the reactor. Each site-isolated reactor effects individual processing of a dedicated region of the substrate as described herein.

The example of MCSIR 400 does not include a mixing vessel in the process path for the full-wafer reactor. However, it is possible and sometimes desirable to include a mixing vessel in the full-wafer reactor process path in order to configure the full-wafer processing module in a manner similar to that of the SIPM.

Figure 5:
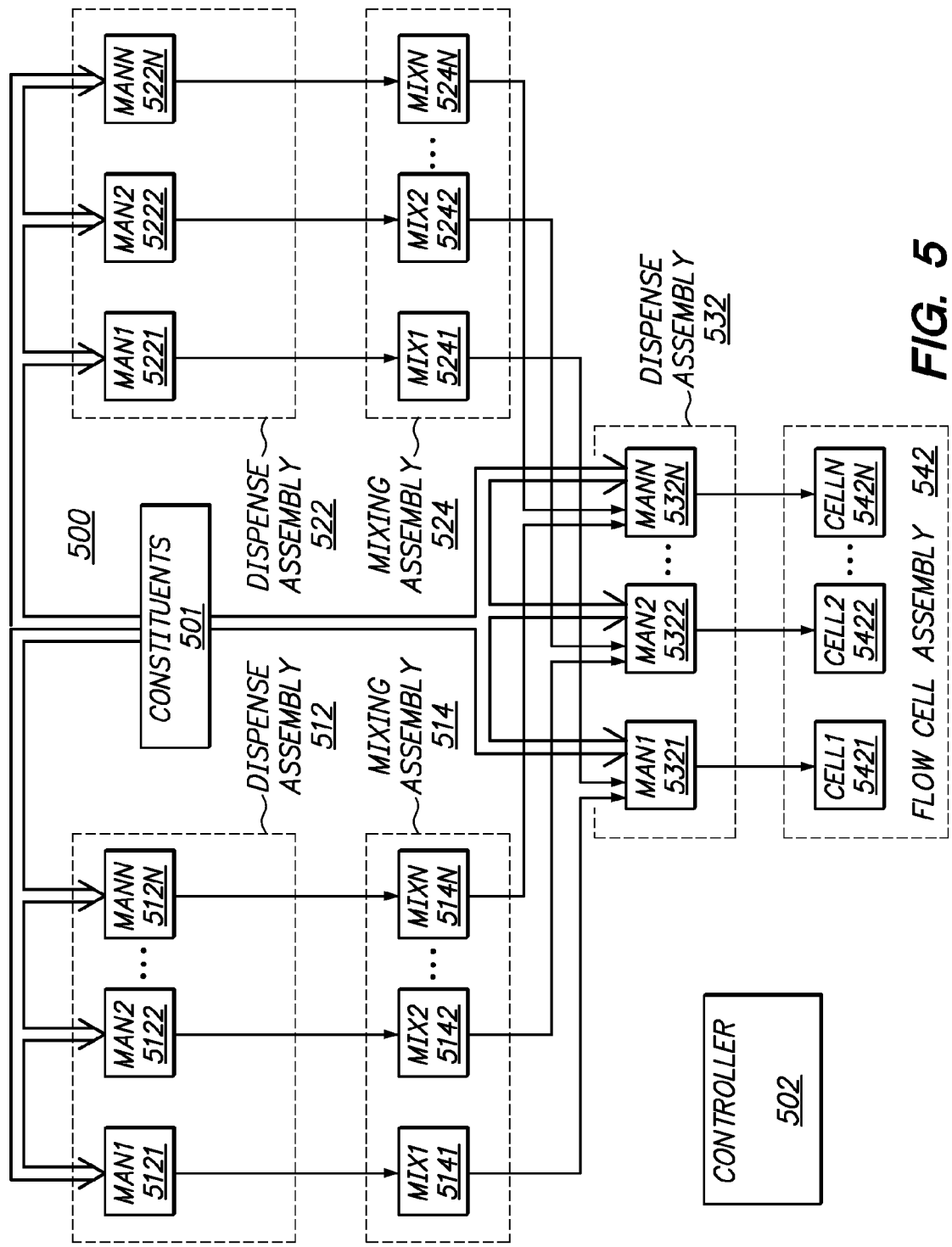
FIG. 5 is a site-isolated processing module (SIPM) of a MCSIR, under an embodiment.

FIG. 5 is a SIPM 500 of a MCSIR, under an embodiment. The SIPM 500 manages or controls simultaneous processing of different regions of a substrate by simultaneously controlling reactions in multiple parallel reactors. Each of the reactors is located proximate to a particular region of a substrate (e.g., wafer). The reactor control includes controlling reagent flow, reagent mixing, reagent delivery, reagent and/or reactor temperature, and/or reagent pH to name a few.

The SIPM 500 includes a first dispense assembly 512 coupled to a first mixing assembly 514. The first dispense assembly 512 includes a number N of mixing vessel manifolds 5121-512N, where the number N of mixing vessel manifolds can be any number. The first dispense assembly 512 of an embodiment includes twenty-eight (28) mixing vessel manifolds, but the SPS is not limited to this number of mixing vessel manifolds and can include any number of mixing vessel manifolds. The inputs of each of the mixing vessel manifolds are coupled to one or more of the chemicals 501. As an example, a mixing vessel manifold of an embodiment includes eight (8) inputs, and each of the inputs is connected to a different one of the chemicals 501. The mixing vessel manifolds are however not limited to eight (8) inputs, and each input is not limited to connection to a different constituent from any other manifold input. Additionally, all mixing vessel manifolds of the dispense assembly 512 are not limited to being of the same configuration. Furthermore, other components (e.g., valves, regulators, mixers, pumps, etc.) can be connected inline between the constituents and the mixing vessel manifolds.

The first mixing assembly 514 includes a number N of mixing vessels 5141-514N, where the number N of mixing vessels can be any number. The first mixing assembly 514 of an embodiment includes twenty-eight (28) mixing vessels, but the SPS is not limited to this number of mixing vessels and can include any number of mixing vessels. The inputs of each of the mixing vessels are coupled to outputs of the mixing vessel manifolds of the first dispense assembly 512. As an example, the mixing vessel of an embodiment includes one (1) input that is connected to an output of a mixing vessel manifold of the first dispense assembly 512. As a more specific example, an input of a first mixing vessel 5141 is connected to an output of a first mixing vessel manifold 5121. The mixing vessels are however not limited to one (1) input, and each input is not limited to connection to one mixing vessel manifold of the first dispense assembly 512.

The SIPM 500 further includes a second dispense assembly 522 coupled to a second mixing assembly 524. The second dispense assembly 522 includes a number N of mixing vessel manifolds 5221-522N, where the number N of mixing vessel manifolds can be any number. The second dispense assembly 522 of an embodiment includes twenty-eight (28) mixing vessel manifolds, but the SPS is not limited to this number of mixing vessel manifolds. The inputs of each of the mixing vessel manifolds are coupled to one or more of the chemicals 501. As an example, and as described above, the mixing vessel manifold of an embodiment includes eight (8) inputs, and each of the inputs is connected to a different one of the chemicals 501. The mixing vessel manifolds are however not limited to eight (8) inputs, and each input is not limited to connection to a different constituent from any other manifold input. Additionally, other components (e.g., valves, regulators, mixers, etc.) can be connected inline between the constituents and the mixing vessel manifolds.

The second mixing assembly 524 includes a number N of mixing vessels 5241-524N, where the number N of mixing vessels can be any number. The second mixing assembly 524 of an embodiment includes twenty-eight 28 mixing vessels, but the SPS is not limited to this number of mixing vessels. The inputs of each of the mixing vessels are coupled to outputs of the mixing vessel manifolds of the first dispense assembly 522. As an example, the mixing vessel of an embodiment includes one (1) input that is connected to an output of a mixing vessel manifold of the first dispense assembly 522. As a more specific example, an input of a first mixing vessel 5241 is connected to an output of a first mixing vessel manifold 5221. The mixing vessels are however not limited to one (1) input, and each input is not limited to connection one mixing vessel manifold of the first dispense assembly 522.

The SPS is modular so alternative embodiments of the SPS can include a different number of dispense assemblies and/or mixing assemblies. For example, the SPS of an alternative embodiment can include two additional dispense assemblies, with each additional dispense assembly coupled to an additional mixing assembly. As another example, the SPS of an alternative embodiment includes only the first dispense assembly 512 and first mixing assembly 514 described above, and does not include the second dispense assembly 522 and second mixing assembly 524. Furthermore, the SPS of alternative embodiments can include a smaller or larger number of mixing vessel manifolds and/or mixing vessels than described above. Additionally, alternative embodiments include different configurations of mixing vessel manifolds and/or mixing vessels; for example, two mixing vessel manifolds can be coupled to a single mixing vessel.

The SIPM 500 includes a third dispense assembly 532. The third dispense assembly 532 includes a number N of site manifolds 5321-532N, where the number N of site manifolds can be any number. The third dispense assembly 532 of an embodiment includes twenty-eight 28 site manifolds, but the SPS is not limited to this number of site manifolds. Each site manifold of an embodiment includes eight (8) inputs, but is not so limited. A first input of each site manifold is connected to an output of a mixing vessel of the first mixing assembly 514, and a second input of each site manifold is connected to an output of a mixing vessel of the second mixing assembly 524. Therefore, using a first manifold 5321 of the third dispense assembly 532 as a more specific example, a first input of the first site manifold 5321 is connected to an output of a first mixing vessel 5141 of the first mixing assembly 514, and a second input of the first site manifold 5321 is connected to an output of a first mixing vessel 5241 of the second mixing assembly 524. One or more of the remaining inputs of each site manifold of the third dispense assembly 532 is connected to one or more of the chemicals 501 as appropriate to the instant processing operations of the SIPM 500. Remaining inputs of each site manifold can however be coupled to other constituent sources in alternative embodiments. Other components (e.g., valves, regulators, mixers, pumps, etc.) can be connected inline between the constituents and the third dispense assembly 532.

Outputs of the third dispense assembly 532 are coupled to a flow cell assembly 542. The flow cell assembly 542, which is proximate to a substrate as described above, includes a number N of flow cells 5421-542N, where the number N of flow cells can be any number. As an example, the flow cell assembly 542 of an embodiment includes 28 flow cells, but the SPS is not limited to this number of flow cells. Each flow cell of an embodiment includes one (1) input, but is not so limited. The input of each flow cell is coupled to outputs of the site manifolds of the third dispense assembly 532. For example, the flow cell of an embodiment includes one (1) input that is connected to an output of a site manifold of the third dispense assembly 532. As a more specific example, an input of a first flow cell 5421 is connected to an output of a first site manifold 5321 of the third dispense assembly 532. The interior of the flow cells can be configured or reconfigured to tailor fluid flow; for example, the interior cavity can be any shape and/or the surface profiles of the interior can be varied so as to control velocities of fluids. Other components (e.g., valves, regulators, mixers, pumps, etc.) can be connected inline between the third dispense assembly 532 and the flow cell assembly 542.

The flow cell assembly 542 therefore includes a series of parallel cells forming site-isolated reactors configured to effect site-isolated processing on a proximate region of a substrate. The site-isolated processing includes processing comprising the constituents or compositions delivered to each cell or reactor of the flow cell assembly 542 as described above.

The embodiment of the SIPM 500 described above includes an equivalent number N of each of mixing vessel manifolds of the first dispense assembly 512, mixing vessel manifolds of the second dispense assembly 522, site manifolds of the third dispense assembly 532, mixing vessels of the first mixing assembly 514 and second mixing assembly 524, and flow cells of the flow cell assembly 542. As described above, however, alternative embodiments can include different numbers of one or more of the mixing vessel manifolds of the first dispense assembly 512, mixing vessel manifolds of the second dispense assembly 522, site manifolds of the third dispense assembly 532, mixing vessels of the first mixing assembly 514 and second mixing assembly 524, and flow cells of the flow cell assembly 542 as appropriate to a processing operations.

A controller 502 is coupled to various components of the SIPM 500 as described above and controls processing operations. The SIPM 500 generally provides processing operations that include global mixing of multiple constituents (e.g., chemicals, composition, etc.) to form a variety of combinations of compositions at each of the first mixing assembly 514 and the second mixing assembly 524. The compositions at this mixing level are delivered to the third dispense assembly 532 at which point additional constituents can be sequenced with the compositions; the resulting compositions are then delivered via the flow cells to a number N of parallel sites on a substrate. The SIPM 500, which supports liquid, gas, and/or plasma reagents, provides the resulting compositions under controlled conditions including controlling chemical composition, chemical sequencing, temperature, pH, in-line mixing, and local environment control to name a few. The SIPM 500 therefore enables flow control of various reagents (having various states) in such a manner as to effect continuous flow of reagents to numerous substrate site or regions in parallel. The SIPM 500 thus allows operators to effect parallel processing at different regions of a substrate while managing multiple flows, flow dynamics, and multiple channels using a minimum set of flow controls.

The SIPM 500 described above is modular and can include any number of any of the components described above. Components (e.g., dispense assembly, mixing vessel manifold, site manifold, mixing assembly, mixing vessels, flow cell assembly, flow cells) can be added or removed from the SIPM 500 as necessary to support processing operations. Furthermore, configurations of components include any number of configurations and are not limited to the configurations described above. For example, changing flow cell form factor (e.g., square instead of circular) involves changing only a top plate of the flow cell. Thus, the SPS is flexible in terms of configurability and ability to handle different types of processing.

Figure 6:
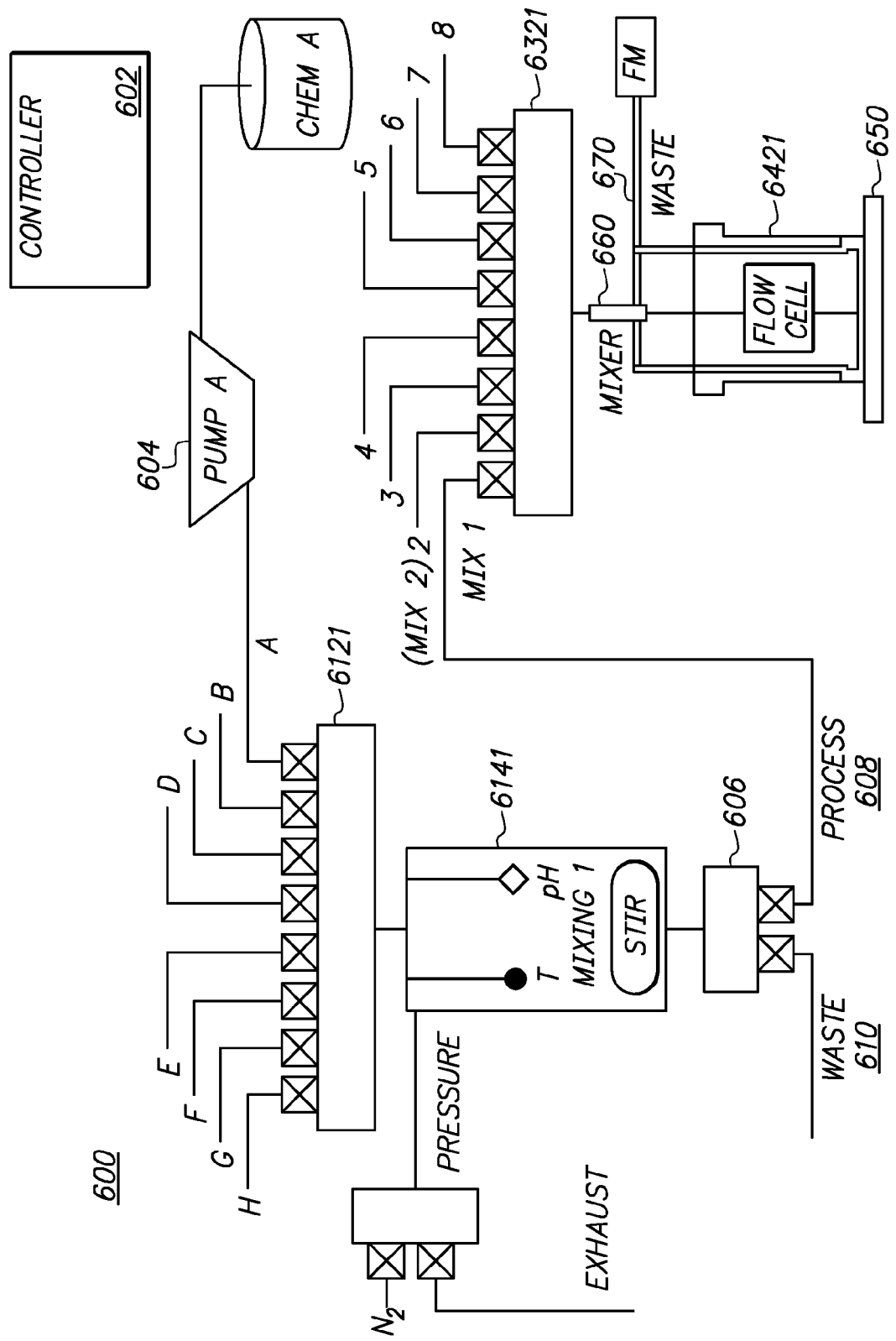
FIG. 6 shows couplings between a subset of components of the SIPM, under an embodiment.

FIG. 6 shows couplings between a subset of components (collectively referred to as SIPM 600) of SIPM 500, under an embodiment. The SIPM 600 includes a first mixing vessel manifold 6121 that includes eight (8) inputs A-H. Each of the inputs is coupled to a constituent in order to selectively receive the constituents during processing operations. As one example of a connection between a constituent and the first mixing vessel manifold 6121, input A of the manifold 6121 is connected to chemical A via a pump 604. The pump 604 is a metering pump used to fill the vessels but is not so limited; alternative embodiments may not include the pump, may include multiple inline pumps, and/or may include a different type of pump. The pump 604 of an embodiment includes a metering pump that allows for precise control of volumetric ratios of each material but is not so limited. Other components (e.g., valves, regulators, mixers, pumps, etc.) can be connected inline between the container holding a constituent (e.g., chemical A) and the pump 604 and/or between the pump 604 and the manifold input A. Other MCSIR components and/or constituents or chemicals (not shown) can be coupled to inputs A-H of the first mixing vessel manifold 6121 in a similar fashion. The first mixing vessel manifold 6121 can be a component of a dispense assembly as described above, but is not so limited.

The SIPM 600 includes a mixing vessel 6141 having an input connected to the output of the first mixing vessel manifold 6121. The mixing vessel 6141 therefore receives the constituents flowed from the first mixing vessel manifold 6121. The mixing vessel 6141 of an embodiment allows for control of parameters under which a composition is generated in the vessel 6141, the parameters including pressure, temperature, and pH to name a few. The mixing vessel 6141 can include devices for stirring or agitating the received constituents. The mixing vessel 6141 includes or is coupled or connected to a flow mechanism 606 that functions to flow compositions from the mixing vessel 6141. As an example, the flow mechanism 606 includes connections for directing the composition to a process 608 or away from a process to waste 610; other routings (not shown) are possible. The mixing vessel 6141 can be a component of a mixing assembly as described above, but is not so limited.

The SIPM 600 includes a site manifold 6321 that includes eight (8) inputs 1-8. One of the inputs 1 is connected to receive the composition output MIX1 of the mixing vessel 6141. Other inputs of the site manifold 6321 can be connected to receive other constituents and/or compositions. For example, as described above, another input 2 of the site manifold 6321 can be connected to receive the composition output MIX2 of another manifold and/or mixing vessel. Further, other or remaining inputs 3-8 of the site manifold 6321 can be coupled to one or more other constituents (not shown).

Output of the site manifold 6321 is connected to a flow cell 6421 that is proximate to a region of a substrate 650. The SIPM 600 includes an optional inline mixer 660 between the site manifold 6321 and the flow cell 6421 for providing inline mixing. The flow cell 6421 receives the composition from the manifold 6321 and uses the composition to process the substrate region during the processing operations. The flow cell 6421 is connected to a waste line 670 that directs effluent (waste) away from the flow cell 6421. The waste line 670 can include a vacuum manifold or valve (not shown) for removing process effluent from the flow cell 6421. The flow cell 6421 can be a component of a flow cell assembly as described above, but is not so limited. A controller 602 is coupled to components of the SIPM 600 and controls processing operations as described below.

An embodiment of SIPM 600 includes a flow meter FM in the waste line in order to characterize the flow through the waste line rather than characterizing flow through the cell. This eliminates the need for numerous flow controllers and instead requires only one flow controller for a single solvent system; multiple flow controllers would be used with multiple solvent systems (e.g., three flow controllers used in system with acid, base and organic solvents).

The components of the SIPM, including the dispense assembly, mixing vessel manifold, mixing assembly, mixing vessels, flow cell assembly, and flow cell, vary in number and configuration as described above. These components are coupled or connected using a variety of other components and/or materials that include valves, tubing or conduit, dispense pumps, flow regulators, pressure regulators, and controllers to name a few. These other components and/or materials include components and/or materials known in the art as appropriate to the configuration and the processing operations.

The configuration of the SIPM described above allows bulk chemicals to be directed to a mixing vessel, through the mixing vessel manifold, and/or to the site-isolated reactor, through the site manifold. If directed to the mixing vessel, the control system enables mixing of solutions of arbitrary composition. The composition of the solution can be varied independently across each of the mixing vessels. The mixing vessels are implemented is such a fashion as to allow stirring, heating, and pH control of the resulting solutions. In addition, the pH and temperature of the resulting solutions can be monitored per flow cell. Furthermore, the flow rate of each solution through the site manifolds is independently variable.

As described above, each manifold (e.g., mixing vessel manifolds, site manifolds) includes a number of inputs or valves (e.g., X inputs, where X is any number 1, 2, . . . ), with each valve coupled or connected to a different chemical source. The chemical source may be liquid, gas or vacuum, for example. The manifold is configured so that the chemicals received at the manifold inputs exit the manifold through a common path. Consequently, the manifold is referred to as an X:1 manifold. The chemicals can be sequenced individually through the manifold or in combinations. When sequenced in combination, an in-line mixer can be used to ensure homogeneous chemical solutions. Check valves can also be incorporate at the entrance of each of the X chemicals to ensure that no backstreaming and, consequently, unwanted mixing of the chemicals occurs.

Figure 7:
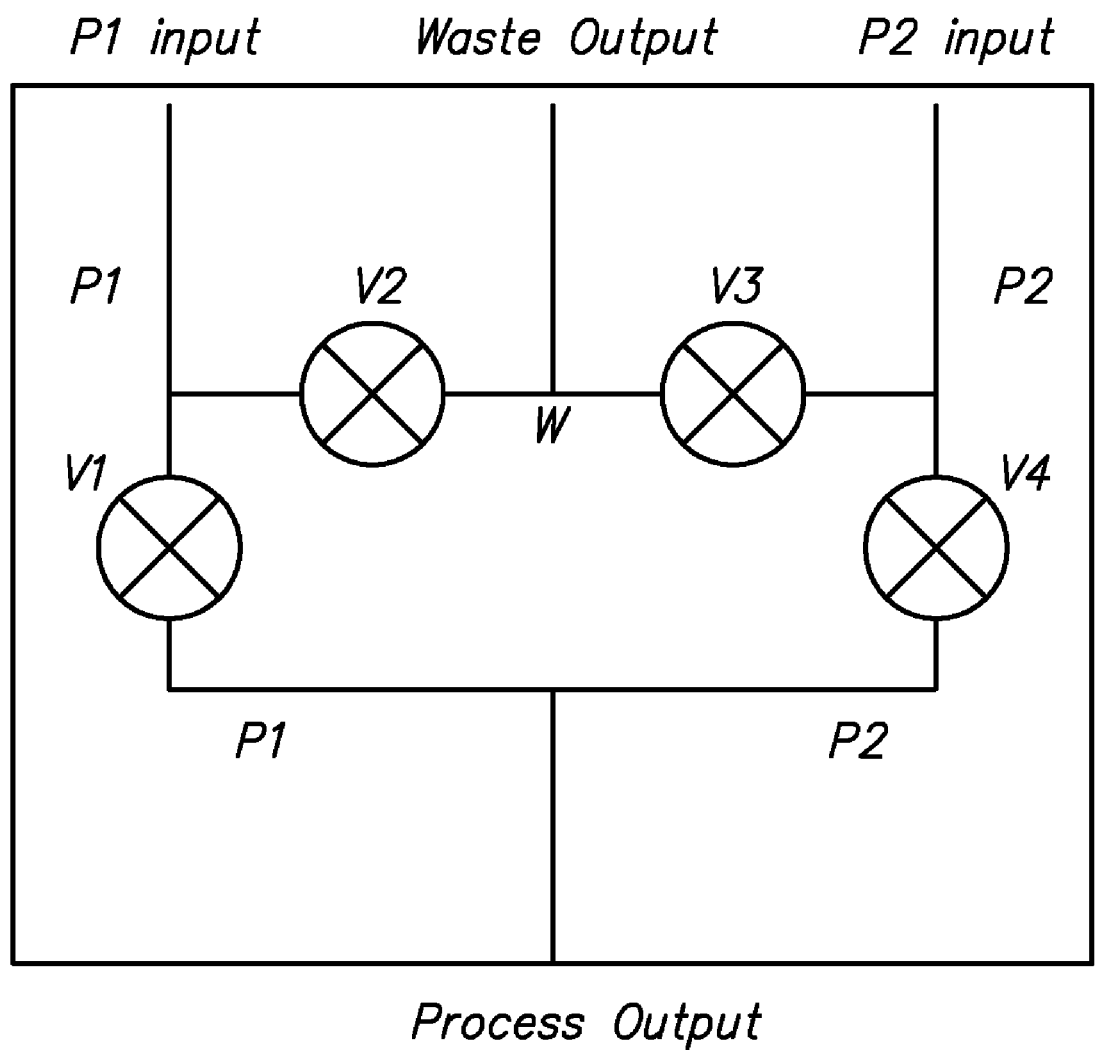
FIG. 7 is a block diagram of a flow cell including independent process and waste paths, under an embodiment.

The flow cells control the flow dynamics of processes of the SIPM. In order to reduce dead volume between chemical changes during the sequence, the flow cells of an embodiment include independent process and waste paths incorporated directly into the cell body. FIG. 7 is a block diagram of a flow cell 700 including independent process P1/P2 and waste W paths, under an embodiment. Each flow cell path incorporates valves V1-V4 to control the process and waste flows. The use of these valves V1-V4 allows, for example, the first process path P1 of the flow cell to be purged while the second path P2 is being used to deliver chemicals for processing of the substrate. This process path control provides superior timing accuracy and enables very precise sequencing of chemicals to a flow cell.

As an example of valve use, a valve configuration of a current process step of a flow cell has valve V1 closed and valve V2 open resulting in a first chemical being purged from the first path to the waste output, and valve V4 open and valve V3 closed resulting in a second chemical being provided to the flow cell via the process output. Upon completion of the current process step and the start of a following process step, the valves can be switched or reconfigured in a manner such that the chemical of the first path P1 is immediately introduced to the substrate via the process output, while the chemical of the second path is purged and the second path is subsequently prepared using the next chemical in the process sequence.

The flow cells of an embodiment include a vacuum manifold to collect and exhaust the process chemicals from the reactor. The vacuum manifold of an embodiment is vented to atmosphere to maintain a constant pressure in the manifold, thereby providing superior predictability of the flow rates, but is not so limited and could instead be coupled to a vacuum source or a pressure source as appropriate to the system configuration.

The flow cells of the SIPM are all connected to a fixture that enables the flow cells to be collectively raised and lowered as a unit. This control of vertical position of the flow cells relative to the substrate allows the reactor volumes to be changed dynamically. An example of use of this function is to raise the flow cells to facilitate static bucket-mode processing, and then to lower the flow cells to facilitate a radial flow pattern.

As described above with reference to FIG. 4, the flow cells comprise the top surface of the site-isolated reactor, while reactor sleeves comprise the side walls of the reactor and the processed substrate comprises the bottom of the reactor. The reactor sleeves are inert sleeves used to provide easy serviceability. For example, the reactor sleeves can be easily replaced if contaminated or in order to provide sleeves comprising sleeve materials that are necessary for chemical compatibility. The sleeves are secured by a reactor block that can comprise one or more of a variety of materials. The reactor block can also be automatically heated and/or cooled under control of the controller to provide processing temperatures that are different from room temperature and as appropriate to difference processes.

The MCSIR also includes a chuck or stage that secures the substrate that is to undergo processing. The chuck can comprise one or more of a variety of mechanisms to secure the substrate including but not limited to vacuum, electrostatics, and/or mechanical clamping. Similar to the reactor block, the chuck can also be automatically heated and/or cooled under control of the controller. The chuck can be mechanically actuated to enable the effective use of robotics to introduce and retrieve substrates from the reactor assembly.

Flow control of constituents through all components of the MCSIR of an embodiment is achieved by varying pressure across connections of the MCSIR. The connections, which can each include at least one tubing connection and/or one or more precision orifices or valves, are matched across the MCSIR for the constituents and constituent parameters of the intended process sequences. The connections of the MCSIR are calibrated prior to any actual use and calibration curves are stored in a database for each connection. The controller uses information of the calibrations in controlling constituent flows during processing operations.

Substrate processing of the MCSIR includes parallel integration of combinatorial processing and conventional full-wafer processing on localized regions of a substrate as described above. Embodiments of the MCSIR support processing operations under control of a controller as described above (e.g., controller 402 of MCSIR 400 (FIG. 4), controller 502 of MCSIR 500 (FIG. 5), controller 602 of MCSIR 600 (FIG. 6)). The controller includes a processor running one or more programs or algorithms that use information of a variety of databases or tables to control operations of various components of the host MCSIR; the databases or tables (not shown) are coupled to the controller processor and can be components of the controller and/or distributed among other components of the MCSIR and/or a host processing system.

The controller of an embodiment provides full computer control/automation of the process sequence. Each of the reactors can be independently controlled over most process parameters, however, some process parameters such as temperature and reactor volume are global to all sites. In instances where different sequences are used in different reactors and a global parameter is changed, the controller enables synchronization of the process steps such that the process sequence executes correctly across all reactors. In addition to process synchronization, the controller enables process sequence triggers that enable a process step to initiate on the system meeting specific target values of parameters such as temperature. These two capabilities further improve the accuracy and precision with which a process sequence can be executed.

Figure 8:
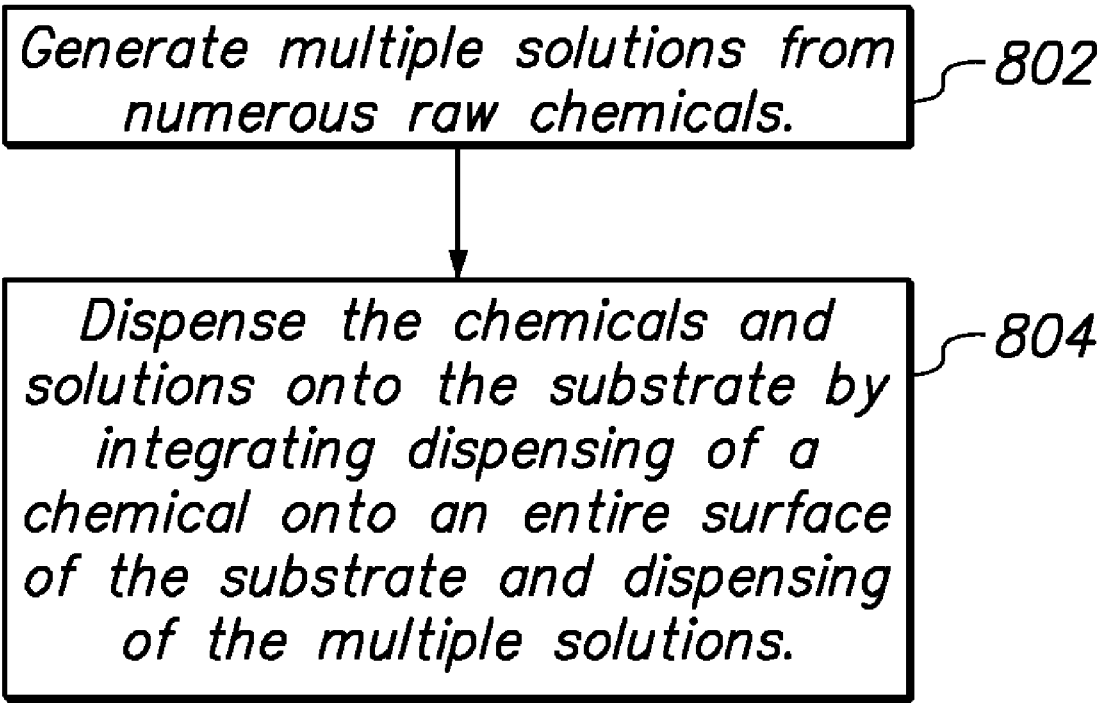
FIG. 8 shows a MCSIR that includes a flow cell assembly mated to a chuck, under an embodiment.

As a general example of controlling substrate processing operations, FIG. 8 is a flow diagram of mixed-mode processing of a substrate. Solutions are generated 802 from numerous raw chemicals. A composition and a parameter is varied in a combinatorial fashion and independently controlled between different ones of the multiple solutions. The chemicals and solutions are dispensed 804 onto the substrate, and the dispensing includes integrating dispensing of a chemical onto an entire surface of the substrate and dispensing of multiple solutions. The dispensing of the multiple solutions includes independently varying one or more of the solution dispensed and a flow among one or more sets of regions of the substrate.

A more specific example of controlling processing operations using the MCSIR controller follows. Operation generally begins when an operator selects and/or sets a sequence and selects and/or sets libraries appropriate to the sequence. A substrate (e.g., wafer) is loaded, and the libraries are pre-staged. The selected processing sequence is then executed. Following execution of the selected sequence the wafer is unloaded and the system is flushed.

The setting of a sequence includes defining constituent or chemical sequencing and associated parameters. Definition of the chemical sequencing includes for example defining one or more of the chemical type, flow time, flow rate, charge, soak, flush time, and process temperature. While flow rates through each flow cell of the MCSIR of an embodiment are approximately the same value, the flow rates can be varied in a serial manner. Flow time, soak time, and flush time can be varied across the MCSIR. The sequencing can include chemical mixing via one or more inline mixers, for example, as described above, or other mixing techniques or components described herein.

Setting a library for the processing sequence of an embodiment includes setting one or more of a concentration of each chemical in a mixture, temperature and pH of each solution, and a total volume of each mixture (a default value is provided from sequence information). Setting of a library is optional.

Wafer loading includes defining a wafer size. Pre-staging of the libraries includes sequencing through the mixing vessels of the MCSIR and adding or dispensing the appropriate amount of each component of the specified constituent. Precision dispense pumps are used to meter individual constituents into the mixing vessels. Delivery of ten (10) milliliters (ml) at +/−1% accuracy takes approximately five (5) seconds in an embodiment. The MCSIR dispenses individual constituents to the mixing vessels in a staggered start with a pre-specified time interval (e.g., one (1) minute) between start of the first and last constituents. Pre-staging of the libraries is targeted for a time period per stage (e.g., fifteen (15) minutes); for sequential wafers, the library pre-staging can be executed in parallel with the process sequence. The MCSIR pre-staging is done under conditions of precise temperature and pH control, and includes integrated mixing of constituents as appropriate to the process sequence.

Execution of the selected process sequence includes initiation of the sequence, and completion of all defined processes of the selected sequence. Data of the process sequence execution is logged as specified by the operator or other user. The substrate (e.g., wafer) is unloaded upon completion of the process sequence. Following removal of the substrate, the MCSIR is flushed to purge process effluent and/or unused constituents from components of the MCSIR. The MCSIR is then pressurized with a gas (e.g., nitrogen) and held in the pressurized state until a subsequent process sequence is initiated.

As one example of process sequencing, the MCSIR supports processing that includes site-isolated deposition in a region of a substrate using the SIPM described above. The deposition of a certain material requires that two chemicals be mixed and dispensed onto the wafer at an elevated temperature. The deposition must be accomplished in a static or bucket mode reactor. In addition, the chemicals cannot be exposed to moisture. Finally, the chemicals are unstable at elevated temperature when mixed, but are stable when not mixed. The MCSIR enables precise control of the timing of each step in this sequence which is critical in achieving efficient integration of this deposition into an existing process. Parameters provided in the following example are provided as examples only and are not intended to limit the MCSIR to processing only under these parameters.

To execute the deposition using the MCSIR described above, and with reference to FIGS. 4-6 above, operation begins by dispensing Chemical A into the mixing vessel through the mixing vessel manifold. The temperature of Chemical A is raised to the desired process temperature and, when Chemical A reaches the process temperature, the controller triggers the dispensing of Chemical B into the mixing vessel. In addition, mechanical mixing of the two chemicals is initiated in the mixing vessel.

The temperature of the solution of Chemical A and B is then raised to a pre-specified process temperature. During the heating cycle, the substrate is moved by the interface onto a robot arm and the substrate chuck is preheated to the process temperature. The substrate remains on the robot arm until the solution reaches the process temperature at which point the substrate is loaded onto the hot wafer chuck. The wafer is actuated into position and the solution is dispensed onto the substrate with the reactor at a height of approximately 10 mm.

At the conclusion of the deposition, the substrate chuck is actively cooled and the reactor height is reduced to 0.25 mm concurrent with the evacuation of the reacting solution. Upon evacuating the solution and cooling the substrate, a second solution is introduced into the reactor in flow mode to rinse the residual chemicals from the surface. The wafer is then retrieved from the reactor and returned via the robotic interface.

The MCSIR of an embodiment includes the use of seals between reactors of the cell assembly and one or more regions of a target substrate. The sealing systems and methods of an embodiment can include two classes of seals. A first class of seal includes one or more contact seals while a second class of seal includes use of a hydrodynamic barrier formed using a sealing fluid. Each of these sealing systems is described in detail in U.S. patent application Ser. No. 11/448,369, filed Jun. 6, 2006.

Figure 9:
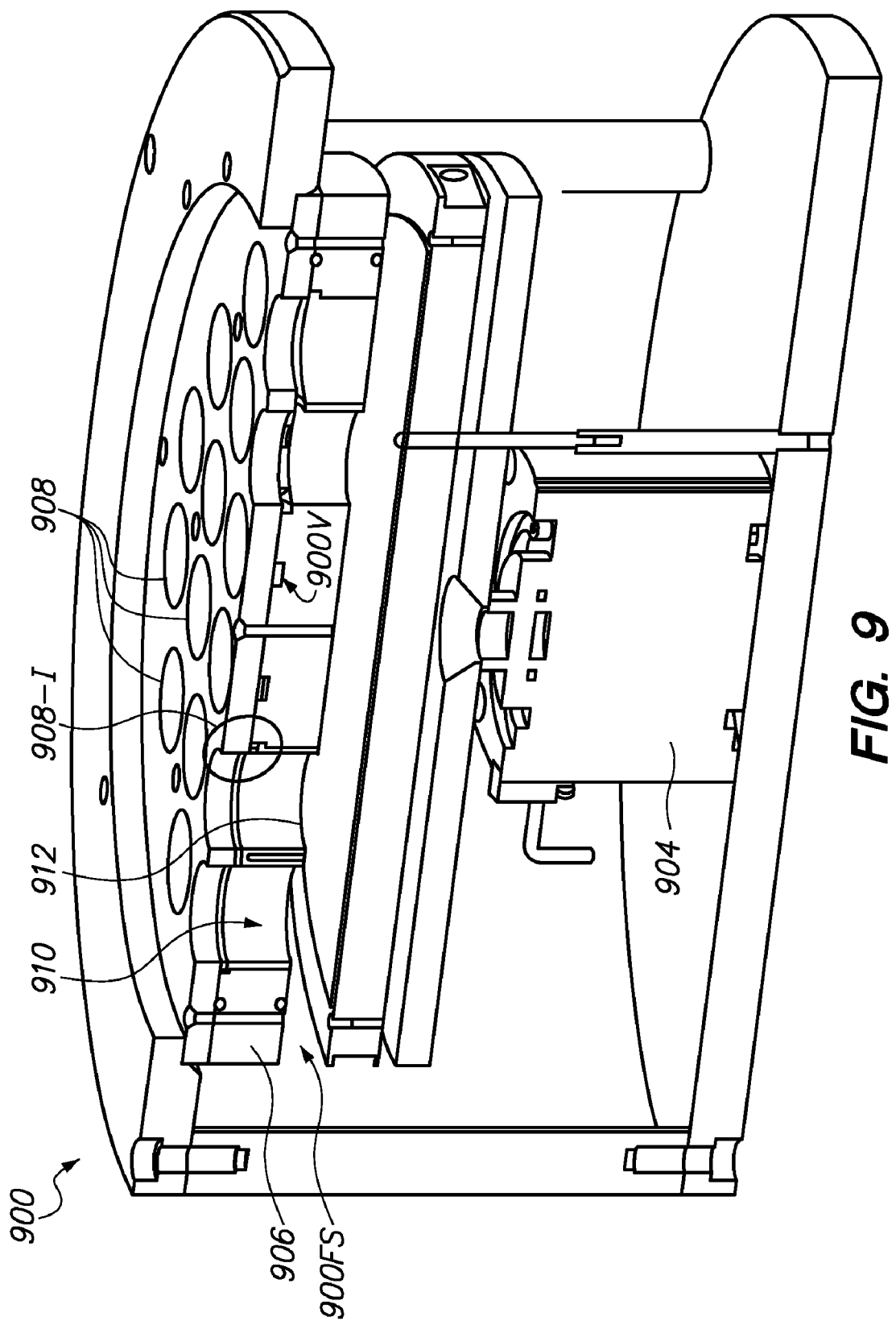
FIG. 9 shows a hydrodynamic sealing system, under an embodiment.

FIG. 9 shows a MCSIR 900 that includes a flow cell assembly 906 mated to a stage or chuck 904 which can secure a substrate, under an embodiment. The MCSIR 900 includes a floating reactor sleeve or wall 910. A floating reactor sleeve 910 is configured to float or be dynamically positionable in each flow cell 908 of the cell assembly reactor block 906. The combination of the flow cell 908 that includes the floating sleeve 910 thus forms a flow cell 908 that provides individual compliance of each reactor edge surface 912 (formed by the floating sleeve 910) with a localized surface of a substrate.

The compliance of each reactor sleeve 910 within the flow cell 908 of the reactor block 906 can be controlled or provided by an external mechanism which, in an embodiment, is an o-ring, but is not so limited. The compliance of each reactor sleeve 910 within the flow cell 908 can also be provided by a flexure-type mechanism integrated directly into the sleeve wall. Each of the reactor sleeve compliance mechanisms are described in detail below. Use of the floating sleeves 910 in each flow cell 908 allows for replacement of individual reactor walls that may become contaminated or otherwise unsuitable for continued use in a reactor. Further, the floating of each flow cell 908 within the reactor block 906 provided by the floating sleeves 910 allows larger manufacturing tolerances of reactor components while still providing a high probability that a seal is achieved for each reactor.

The system of an embodiment uses vacuum to provide a tertiary seal as described above. The vacuum is provided via a series of vacuum channels 900V in or through the reactor block 906. The vacuum works in conjunction with the face seal 900FS, which is configured to contact the processed substrate to ensure effective sealing by the tertiary seal. This face seal 900FS therefore establishes a perimeter seal to the substrate using the vacuum or alternatively using pneumatic force.

The plenum area external to the isolated reactor chambers 908 of an embodiment can be pressurized. The pressurization is used, for example, to prevent leakage of materials outside of each isolated reactor chamber 908. Also, pressurizing the plenum and then measuring the pressure drop over time allows for monitoring of the sealing performance of the floating sleeves 910. Furthermore, pressurization of the plenum prevents or minimizes the chance of release or uncontrolled venting of potentially toxic compounds from the isolated reactor chambers 908.

As an alternative to the contact sealing system described above a second class of seal, referred to herein as a hydrodynamic sealing system, uses a sealing fluid to contain reactor contents by forming a hydrodynamic barrier between reactors of a flow cell assembly. The hydrodynamic barrier takes the place of one or more conventional contact seals.

Figure 10:
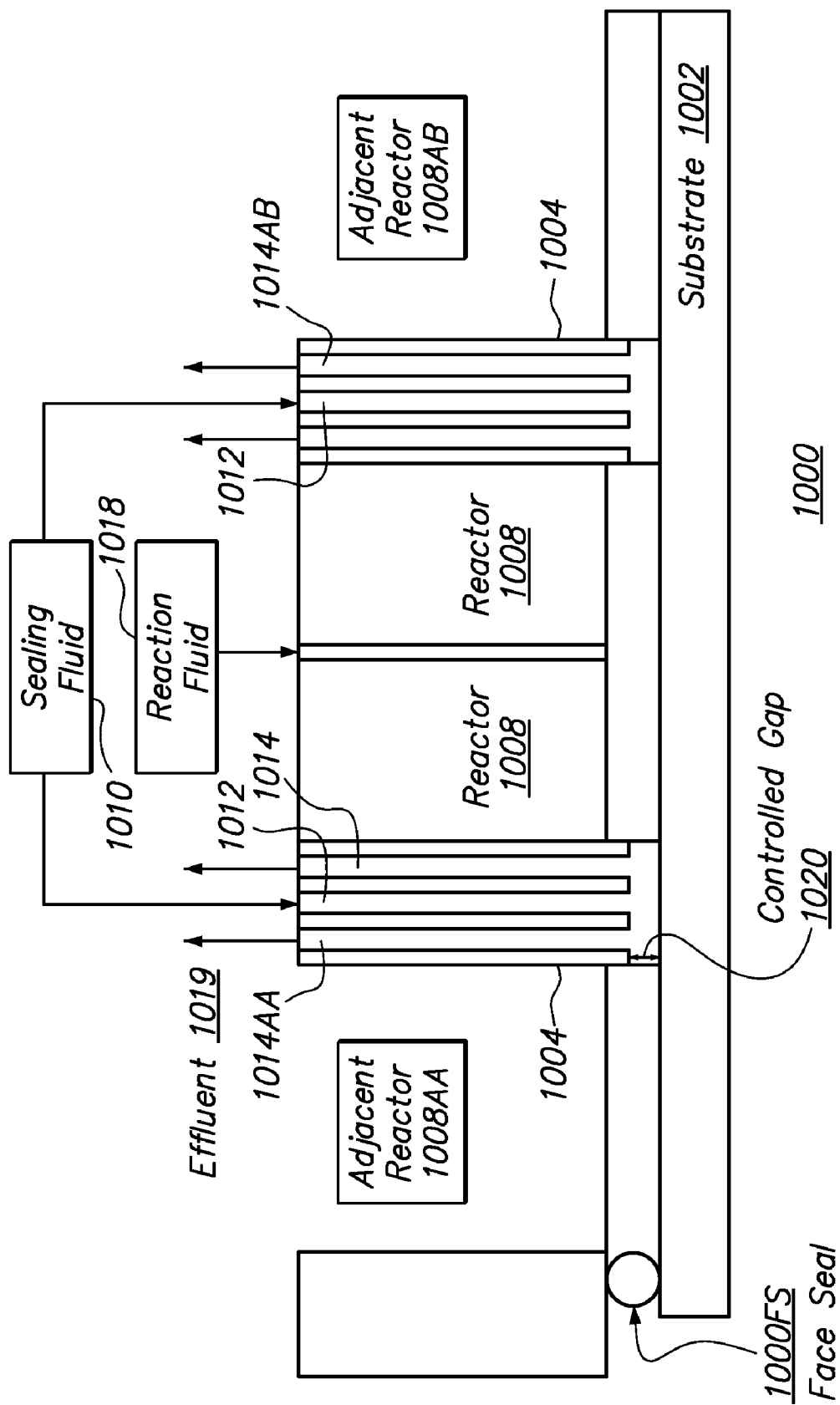
FIG. 10 is a shows a hydrodynamic sealing system, under an embodiment.

FIG. 10 shows a hydrodynamic sealing system 1000, under an embodiment. The hydrodynamic sealing system 1000 uses a sealing fluid 1010 to form a hydrodynamic barrier configured to be the primary containment that isolates each reactor 1008 of a flow cell assembly from a number of adjacent reactors 1008AA and 1008AB. The hydrodynamic sealing system 1000 of an embodiment also includes a face seal 1000FS in a region of the perimeter of a substrate. The face seal 1000FS encapsulates approximately the entire area of a substrate 1002 and provides secondary containment of the reaction species. The sealing fluid 1010 is inert to the reaction of one or more of the reactors 1008, 1008AA, 1008AB so that the sealing fluid 1010 does not introduce contamination to any reaction of any reactor 1008, 1008AA, 1008AB.

The hydrodynamic seal is provided by positioning the reactors above a surface of the substrate 1002 without substrate contact. The positioning of the reactors in proximity to the substrate 1002 results in formation of a controlled gap 1020 between the bottom portion of the reactors and the substrate 1002. The reactors therefore do not come into physical contact with the substrate. The span of the controlled gap 1020 can be modulated via the characteristics (e.g., fluid constituents, hydrophobicity, hydrophilicity, reactivity, viscosity, etc.) of the sealing fluid 1010 and/or the reactants of the reactors 1008, 1008AA, 1008AB.

A hydrodynamic bearing mechanism controls the float height of the reactors 1008 above the substrate, and thus the controlled gap 1020, by controlling respective pressures of the sealing fluids 1010 and the effluent channel but is not so limited. The sealing fluid 1010 is introduced into the hydrodynamic sealing system 1000 through a first set of channels 1012 in a perimeter space 1004 or wall of the reactor 1008. The first set of channels 1012 of an embodiment includes one channel but alternative embodiments can include any number or type of channels or passageways. Reaction fluid 1018 is also introduced into the reactor 1008 and contained in the reactor 1008 for the duration of a static reaction involving the reaction fluid 1018. The sealing fluid 1010 serves to form a hydrodynamic barrier that contains the reaction fluid 1018 in the reactor 1008 to which it is introduced. In one embodiment, this can be achieved by choosing an appropriate (e.g., higher) flow of the sealing fluid 1010 and/or (e.g., short) process duration to limit out-diffusion of the reaction fluid 1018 from the reactor 1008 to which it is introduced. The hydrodynamic seal thus encapsulates a specific area or region of the substrate 1002 within the reactor 1008 by limiting the edge-to-edge flow of the reaction fluid 1018 to the approximate boundaries established by the sealing fluid 1010. Upon completion of a reaction, the reaction fluid 1018 is removed from the reactor 1008 (e.g., via suction) but is not so limited.

The sealing fluid 1010 is collected along with reaction effluents 1019 through a second set of channels 1014 in a perimeter space 1004 of the reactor 1008. The second set of channels 1014 of the reactor perimeter space 1004 is located between the first set of channels and the reactor to which the channels 1014 correspond, in an area defined as a sealing channel. The second set of channels 1014 of an embodiment includes one channel but alternative embodiments can include any number or type of channels or passageways. The hydrodynamic sealing system of an embodiment includes a vacuum source for collecting the sealing fluid 1010 and/or reaction effluents 1019 through the second set of channels 1014.

The hydrodynamic sealing system described above provides reactor-to-reactor isolation without having reactor components in direct physical contact with the substrate, thereby reducing or eliminating the possibility of reaction contamination due to physical contact with the reactor. The hydrodynamic sealing system also provides two levels of containment to ensure no leakage of reactants to the atmosphere.

The substrate processing of an embodiment is used in one or more substrate processing systems and processes to form material (e.g., produces a layer or structure) on a substrate. The forming of material on a substrate as used herein encompasses both forming the material directly on the substrate material as well as forming the material on another material previously formed on the substrate, but may not be so limited. The substrate processing enables production of very small structures and features on substrates (e.g., at the nanometer size scale) at very low cost, which can be useful in the manufacture of a variety of products. Additionally, the substrate processing can take advantage of one or more capabilities enabled by commercial substrate processing apparatus and methods (e.g., commercial semiconductor processing equipment and methods) to facilitate and/or enhance the performance of substrate processing to form material on a substrate.

The substrate processing can include a substrate of any size. For example, the substrate processing can be used in the processing of small semiconductor substrates having areas of less than one square inch up to twelve (12) inch (300 millimeter (mm)) or larger semiconductor substrates used in the production of many electronic components. In general, there is no limit to the size of substrates that can be processed. For example, the substrate processing can be used to process each succeeding larger generation of semiconductor substrates used to produce electronic components. The substrate processing can also be used to process the relatively large substrates that are used in the production of flat panel displays. Such substrates include rectangular substrates on the order of approximately one square meter, but larger substrates can be used. The substrate processing can also be scaled for use in roll-to-roll processing applications for flexible substrates having a fixed width, but (theoretically) unlimited length (a manner of substrate processing that can be particularly useful in the production of flat panel displays); for example, such substrate rolls can be hundreds of feet long.

The substrate processing can be used in the processing of a single substrate or multiple substrates (e.g., batch processing). For example, in wet semiconductor processing, a single substrate can be processed or a batch of, for example, 13, 25 or 50 substrates can be processed at a single time. In dry semiconductor processing and flat panel display production, typically, a single substrate is processed at one time.

The substrate processing described herein can include wet processing and/or dry processing. In wet processing, a substrate is processed using a fluid. For example, the substrate can be immersed, in whole or in part, in a fluid having specified characteristics (e.g., a specified chemical composition). Also, for example, a fluid can be sprayed on to the substrate in a specified manner. Wet processing for use with the substrate processing of an embodiment can make use of any of a variety of chemical constituents, as appropriate for the desired processing.

In dry processing (e.g., physical vapor deposition, chemical vapor deposition, plasma-enhanced chemical vapor deposition, and atomic layer deposition), a plasma or gas is used to produce a desired interaction with a substrate that processes a substrate surface in a specified way. Dry processing for use with the substrate processing can make use of inert or reactive gases, as appropriate for the desired processing.

Any of a variety of chemical constituents or other reactants (collectively referred to herein as constituents or chemical constituents) can be used by a substrate processing system of an embodiment to effect substrate processing and related processes. The constituents can be in the liquid phase, gaseous phase, and/or some combination of the liquid and gaseous phases (including, for example, the super-critical fluid phase). The constituents used and their concentrations, as well as the mixture of constituents, will depend on the particular process step(s) to be performed. The chemical delivery system can enable precise control of the molar concentrations, temperature, flow rate and pressure of chemical constituents as appropriate to the process. The chemical delivery system can also provide appropriate filtration and control of contamination.

The above description of illustrated embodiments of the substrate processing systems is not intended to be exhaustive or to limit the substrate processing systems to the precise form disclosed. While specific embodiments of, and examples for, the substrate processing systems are described herein for illustrative purposes, various equivalent modifications are possible within the scope of the substrate processing systems, as those skilled in the relevant art will recognize. The teachings of the substrate processing systems provided herein can be applied to other processing systems and methods, not only for the systems and methods described above.

The elements and acts of the various embodiments described above can be combined to provide further embodiments. These and other changes can be made to the substrate processing systems in light of the above detailed description.

In general, in the following claims, the terms used should not be construed to limit the substrate processing systems to the specific embodiments disclosed in the specification and the claims, but should be construed to include all processing systems that operate under the claims.

What is claimed:

1. A method of mixed-mode processing of a substrate, comprising:
   generating a plurality of solutions from a plurality of chemicals, wherein a composition of the solutions is varied in a combinatorial fashion; and dispensing the chemicals and the solutions through a fluid delivery system to a conventional processing module and a combinatorial processing module, wherein the combinatorial processing module comprises a plurality of site isolated reactors defining a plurality of site isolated regions on the substrate, wherein the delivery system feeding the combinatorial processing module is shared with the delivery system feeding the conventional processing module, such that the solution delivered to a first site isolated region in the combinatorial processing module can be varied independently from the solution delivered to a second site isolated region in the combinatorial processing module.

2. The method of claim 1, wherein the composition of the solutions is varied according to a recipe for one or more process sequences that each include the generating and the dispensing.

3. The method of claim 1, comprising synchronizing a plurality of process sequences that each includes the generating and the dispensing.

4. The method of claim 1, comprising controlling timing of the dispensing across the plurality of site isolated regions according to a global parameter for a process sequence that includes the generating and dispensing.

5. The method of claim 4, wherein the global parameter includes one or more of time, temperature, and pH.

6. The method of claim 1, wherein the generating includes statically generating at least one of the plurality of solutions.

7. The method of claim 1, wherein the generating includes dynamically generating at least one of the plurality of solutions.

8. The method of claim 1, wherein the generating includes generating in series at least one set of the plurality of solutions.

9. The method of claim 1, wherein the generating includes generating in parallel at least one set of the plurality of solutions.

10. The method of claim 1, wherein the dispensing of the plurality of solutions includes dispensing solutions in series to each region of a set of the plurality of site isolated regions.

11. The method of claim 1, wherein the dispensing of the plurality of solutions includes dispensing solutions in parallel to regions of a set of the plurality of site isolated regions.

12. The method of claim 1, comprising controlling the dispensing of a chemical onto the entire surface of the substrate using at least one first set of process sequences.

13. The method of claim 1, comprising controlling the dispensing of the plurality of solutions using at least one second set of process sequences.

14. The method of claim 1, comprising controlling the dispensing of a chemical onto the entire surface of the substrate using at least one first set of processes and then controlling the dispensing of the plurality of solutions using at least one second set of processes.

15. The method of claim 1, comprising controlling the dispensing of the plurality of solutions using at least one second set of processes and then controlling the dispensing of a chemical onto the entire surface of the substrate using at least one first set of processes.

16. The method of claim 1, comprising controlling the dispensing of the plurality of solutions using one or more of serial, rapid serial, serial/parallel, or parallel flows.

17. The method of claim 1, comprising controlling the dispensing of the plurality of solutions to serially flow the solutions to each region of a first set of the plurality of site isolated regions.

18. The method of claim 1, comprising controlling the dispensing of the plurality of solutions to serially flow the solutions to each of the plurality of site isolated regions.

19. The method of claim 1, comprising controlling the dispensing of the plurality of solutions to flow in parallel the solutions to each region of a first set of the plurality of site isolated regions and a second set of the plurality of site isolated regions.

20. The method of claim 1, comprising controlling the dispensing of the plurality of solutions to flow in parallel the solutions to each of the plurality of site isolated regions.

21. The method of claim 1, comprising controlling the dispensing of the plurality of solutions to serially flow the solutions to each region of a first set of the plurality of site isolated regions and to flow in parallel the solutions to each region of a second set of the plurality of site isolated regions.

22. The method of claim 1, wherein the solution delivered to the conventional processing module is varied independently from the solutions delivered to the site isolated reactors in the combinatorial processing module.

* * * * *